(12) United States Patent
Kim (10) Patent No.: US 8,829,927 B2
(45) Date of Patent: Sep. 9, 2014

(54) APPARATUS AND METHOD FOR MEASURING CAPACITANCE IN TOUCH SENSOR

(75) Inventor: Tae Gyu Kim, Namyangju (KR)

(73) Assignee: Zinitix Co., Ltd., Yongin-Si (KR)

( * ) Notice: Subject to any disclaimer, the term of this patent is extended or adjusted under 35 U.S.C. 154(b) by 361 days.

(21) Appl. No.: 13/280,079

(22) Filed: Oct. 24, 2011

(65) Prior Publication Data

US 2013/0099804 A1  Apr. 25, 2013

(51) Int. Cl.
*G01R 27/26* (2006.01)
*H03K 17/96* (2006.01)
*G06F 3/044* (2006.01)

(52) U.S. Cl.
CPC .............. *G06F 3/044* (2013.01); *H03K 17/962* (2013.01); *H03K 2217/960715* (2013.01)
USPC ............ 324/679; 324/686; 345/173; 345/174

(58) Field of Classification Search
USPC ............................ 324/658–690; 345/173–178
See application file for complete search history.

(56) References Cited

U.S. PATENT DOCUMENTS

| | | | | |
|---|---|---|---|---|
| 5,565,658 A | * | 10/1996 | Gerpheide et al. | 178/18.02 |
| 7,379,054 B2 | * | 5/2008 | Lee | 345/173 |
| 7,737,940 B2 | | 6/2010 | Wu et al. | |
| 2008/0048997 A1 | * | 2/2008 | Gillespie et al. | 345/174 |
| 2008/0142281 A1 | * | 6/2008 | Geaghan | 178/18.06 |
| 2010/0045310 A1 | * | 2/2010 | Betancourt | 324/686 |
| 2011/0187389 A1 | | 8/2011 | Han et al. | |
| 2011/0267309 A1 | * | 11/2011 | Hanauer et al. | 345/174 |

FOREIGN PATENT DOCUMENTS

| | | |
|---|---|---|
| JP | 2008-058925 A | 3/2008 |
| KR | 100601151 B1 | 7/2006 |
| KR | 1020090000532 A | 1/2009 |
| KR | 1020090030114 A | 3/2009 |

* cited by examiner

*Primary Examiner* — Patrick Assouad
*Assistant Examiner* — Alexander J Nemtzow (57) ABSTRACT

An apparatus and method are provided to rapidly and accurately measure the variation of capacitance in a panel load of a touch sensor and thus increase touch sensitivity and noise resistance. The apparatus includes a panel driver configured to drive a panel load in the touch sensor according to a reference voltage, and a capacitive load detector configured to measure capacitance of the panel load by sensing a panel load driving current that is applied to the panel load by the panel driver.

12 Claims, 6 Drawing Sheets

APPARATUS AND METHOD FOR MEASURING CAPACITANCE IN TOUCH SENSOR

FIELD OF THE INVENTION

The present invention relates to a technology for measuring the capacitance of a touch sensor and, more particularly, to an apparatus and method for measuring capacitance of a touch sensor, which are adapted to accurately measure the variation of capacitance in a short time.

BACKGROUND OF THE INVENTION

In a touch sensor, capacitance is generated depending on a capacitor element or an equivalent of the capacitor element formed by material or human contact. It is well known that capacitance may form between a pad and a human body when the body comes within a certain distance of the pad, even if the body does not touch the pad directly.

Capacitance also varies depending on the distance between the pad and a nearby human body. Capacitance increases as the human body comes closer to the pad, and decreases as the human body moves away from the pad.

In other words, the distance between the pad and the human body can be detected with accuracy by measuring the capacitance between the pad and the human body. As such, the measured capacitance can be used to determine whether or not a sensor is being touched. For instance, if the measured capacitance is greater than a predetermined capacitance, it may be determined that the sensor is being touched, and if the measured capacitance is not greater than the predetermined capacitance, it may be determined that the sensor is not being touched.

The predetermined capacitance may be set based on the natural deviation in initial capacitance. The natural deviation is caused by variation in an environment and may be calculated by conducting an experiment. The initial capacitance may be measured in a non-touched state of the sensor when the touch sensor is powered on.

The above capacitance measuring method may be applied to a touch sensor integrated circuit (IC) that is implemented with semiconductor materials. The touch sensor IC has been replacing mechanical switches in a variety of electronic products, such as cellular phones, television receivers, air conditioners, microwave ovens, and so on.

The capacitance generated between a pad of the touch sensor IC and a human body may range from about several picofarads to several tens of picofarads. As such, a variety of methods have been proposed to accurately calculate or measure capacitance.

As one example of a capacitance measuring method in accordance with the related art, capacitance may be measured based on a charging time of a capacitor. In such a method, the capacitor is discharged to the ground, and then charged up to a reference voltage level by using a constant current source. When the capacitor is being charged, the charging time is measured by a timer that counts high-speed clocks.

In the above capacitance measuring method, the capacitor must be discharged in a considerably short time because of the limitations of the high-speed clock of the timer. Also, the current source in this capacitance measuring method supplies a very small current so that the capacitor is charged long enough to accurately measure the capacitance.

The smaller the charging current becomes, the greater the values that can be obtained from the timer. However, if the charging current is too small, influences from external noise and a parasitic current within the touch sensor may increase. As such, the charging time of the capacitor may be increased or decreased by the noise. Thus, the capacitor may not be efficiently charged.

As another example of a capacitance measuring method of the related art, capacitance may be measured based on a discharging time of the capacitor. More specifically, the capacitor may be charged up to a supply voltage (VDD) level, and then discharged to the reference voltage level using a resistor that is connected to the ground. When the capacitor is being discharged, the discharging time is measured by a timer that counts high-speed clocks.

In this capacitance measuring method, the capacitor must be fully charged in a considerably short time due to the limitations of the high speed clock of the timer. Also, a considerably large resistor (having resistance of at least one mega-ohm) should be employed for discharging the capacitor to accurately measure the capacitance. The discharging current may range from several hundreds of pico-amperes to several tens of micro-amperes when the charged capacitor is discharged through the resistor.

As described above, the capacitance generated between the pad and the human body ranges from about several picofarads to several tens of picofarads. As such, the smaller the discharging current becomes, the greater the values that can be obtained from the timer. However, if the discharging current is very small, influences from external noise and a parasitic current within the touch sensor may increase, and the discharging time of the capacitor may be increased or decreased by the noise. Accordingly, the capacitor cannot be efficiently discharged, and it is difficult to measure the discharging time of the capacitor.

Moreover, the capacitance measuring methods of the related art cannot properly measure mutual capacitance due to charge sharing. If the capacitance of a target capacitor is accurately measured, the mutual capacitance may also be accurately measured. However, if it is difficult to accurately measure capacitance, a considerably large capacitor is used. As a result, an external capacitor is used and different weight values are set on panels to calculate the capacitance.

SUMMARY OF THE INVENTION

In view of the above, the present invention provides an apparatus and method for measuring capacitance in a touch sensor, which are adapted to rapidly and accurately measuring the variation of capacitance in a panel load of the touch sensor.

Further, the present invention provides an apparatus and method for measuring capacitance in a touch sensor, which are adapted to increasing touch sensitivity and noise resistance.

In accordance with an aspect of the present invention, there is provided an apparatus for measuring capacitance in a touch sensor, the apparatus including:

a panel driver for driving a panel load according to a reference voltage; and a capacitive load detector for measuring a capacitance of the panel load by sensing a panel load current which is applied from the panel driver to the panel load.

In accordance with another aspect of the present invention, there is provided an apparatus for measuring capacitance in a touch sensor, the apparatus including:

a panel drive circuit including:
a first PMOS transistor; and a first NMOS transistor including a drain electrode serially connected to a drain electrode of the first PMOS transistor and a source electrode connected to a ground source, and a current measuring circuit including:

a second PMOS transistor including a gate electrode connected to a gate electrode of the first PMOS transistor;

a second NMOS transistor including a gate electrode connected to a gate electrode of the first NMOS transistor, a drain electrode serially connected to a drain electrode of the second PMOS transistor and a source electrode connected to the ground source;

a third NMOS transistor including a drain electrode serially connected to the drain electrode of the second NMOS transistor and a source electrode connected to the ground source;

a fourth NMOS transistor including a gate electrode connected to a gate electrode of the third NMOS transistor and a source electrode connected to the ground source;

a third PMOS transistor including a drain electrode serially connected to a drain electrode of the fourth NMOS transistor;

a fourth PMOS transistor including a gate electrode connected to a gate electrode of the third PMOS transistor; and a sensing capacitor including one end serially connected to a drain electrode of the fourth PMOS transistor.

In accordance with another aspect of the present invention, there is provided a method for measuring capacitance in a touch sensor, the method including:

performing a transition of a reference voltage from a first level to a second level, which is higher than the first level, when the touch sensor is initialized; and measuring a load capacitance of a panel load of the touch sensor by measuring a sensing capacitance when a load voltage is converged on the second level with the lapse of a fixed time from the transition of the reference voltage.

In accordance with another aspect of the present invention, there is provided a method for measuring capacitance in a touch sensor, the method including:

performing a transition of a reference voltage from a second level to a first level, which is lower than the second level, when the touch sensor is initialized; and measuring a load capacitance of a panel load of the touch sensor by measuring a sensing capacitance when a load voltage is converged on the first level with the lapse of a fixed time from the transition of the reference voltage.

BRIEF DESCRIPTION OF THE DRAWINGS

The above and other objects and features of the present invention will become apparent from the following description of embodiments given in conjunction with the accompanying drawings, in which.

DETAILED DESCRIPTION OF THE EMBODIMENTS

A basic operation of a touch sensor is to sense variation in capacitance in a panel load caused by a touch. Sensing technologies of the related art determine whether or not the touch sensor is being touched using approximate values because they cannot accurately sense variation of the capacitance. As a result, a circuit embodied in the touch sensor becomes complex, and optional specifications should be considered depending on the size of the panel load.

The present invention is directed to a technology that is adapted to more accurately measuring the capacitance of a panel load.

The present invention enables a touch sensor to be driven at a designated level, regardless of the size of the panel load. In this case, the capacitance of the panel load can be accurately measured. Thus, the distance between the touch sensor and the nearby human body that may touch the touch sensor may be measured linearly based on the capacitance measured between a pad and the human body.

The advantages and features of the present invention and methods in accordance with the present invention will be apparent from the following description of embodiments given in conjunction with the attached drawings. Wherever possible, the same reference numerals will be used throughout this disclosure, including the drawings, to refer to the same or like parts.

Hereinafter, embodiments of the present invention will be described in detail with reference to the accompanying drawings so that they can be readily implemented by those skilled in the art.

Figure 1:
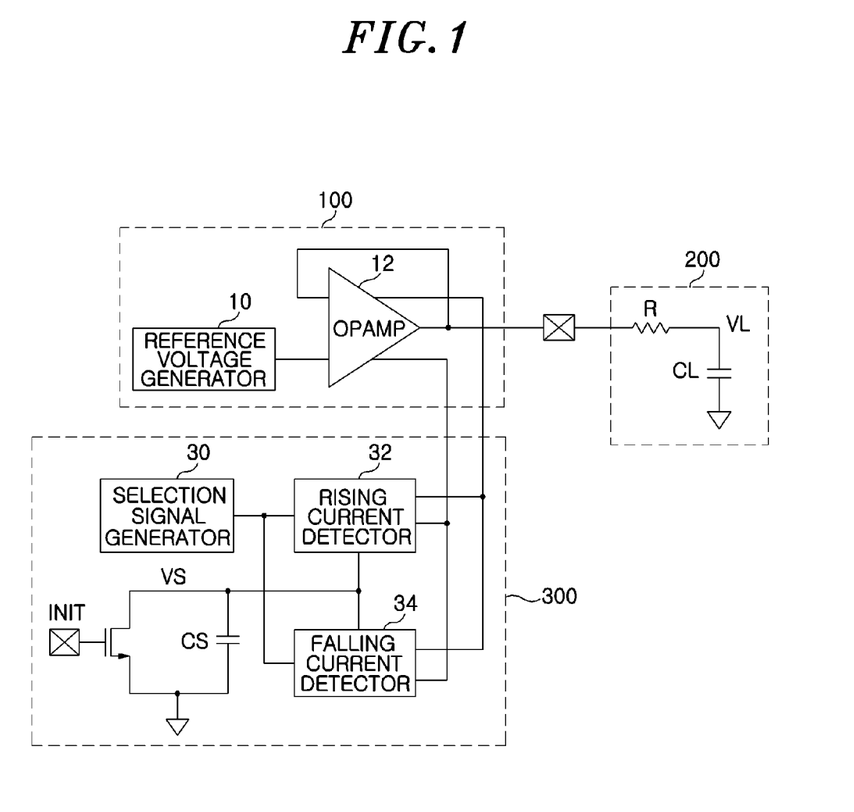
FIG. 1 is a block diagram schematically showing an apparatus for measuring capacitance of a touch sensor in accordance with an embodiment of the present invention.

FIG. 1 is a block diagram of an apparatus for measuring capacitance of a touch sensor in accordance with an embodiment of the present invention. The apparatus includes a panel driver 100, a panel load 200 and a capacitive load detector 300.

Referring to FIG. 1, the panel driver 100 is used for driving the panel load 200. This panel driver 100 includes a reference voltage generator 10, and an operational amplifier (OP Amp) 12.

The reference voltage generator 10 is used for applying a reference voltage to the operational amplifier 12. The reference voltage may be applied from the exterior to the reference voltage generator 10, and the reference voltage may vary depending on the external reference voltage. The operational amplifier 12 drives the panel load 200 with the reference voltage applied from the reference voltage generator 10. At this time, the operational amplifier 12 supplies a driving current to the panel load 200.

The panel load 200 charges an internal load capacitor CL according to the driving current from the operational amplifier 12.

The capacitive load detector 300 measures the capacitance of the load capacitor CL of the panel load 200. More specifically, the capacitive load detector 300 detects the driving current that is applied from the panel driver 100 to the panel load 200, and derives the capacitance of the load capacitor CL from the panel's driving current.

The capacitive load detector 300 includes a selection signal generator 30, a rising current detector 32, a falling current detector 34, and a sensing capacitor CS.

The selection signal generator 30 generates a selection signal having a high or low logic state. The selection signal generated in the selection signal generator 30 is applied to the rising current detector 32 and the falling current detector 34.

When the selection signal is in the high logic state, the rising current detector 32 is inactivated. On the other hand, when the selection signal is in the low logic state, the rising current detector 32 is activated. The activated rising current detector 32 detects a rising current component of the panel's driving current. The rising current component corresponds to a charging current of the panel load 200.

When the selection signal is in the low logic state, the falling current detector 34 is inactivated. On the other hand, when the selection signal is in the high logic state, the falling current detector 34 is activated. The activated falling current detector 34 detects a falling current component of the panel's driving current. The falling current component corresponds to a discharging current of the panel load 200.

Such a rising or falling current component, detected by the rising or falling current detector 32 or 34, is charged into the sensing capacitor CS.

If a predetermined time passes from the point in time when the rising current component starts to charge, the sensing capacitor CS becomes fully charged. In that case, the electrical potential of the sensing capacitor CS is no longer varied, and the capacitance of the load capacitor CL may be measured.

Figure 2:
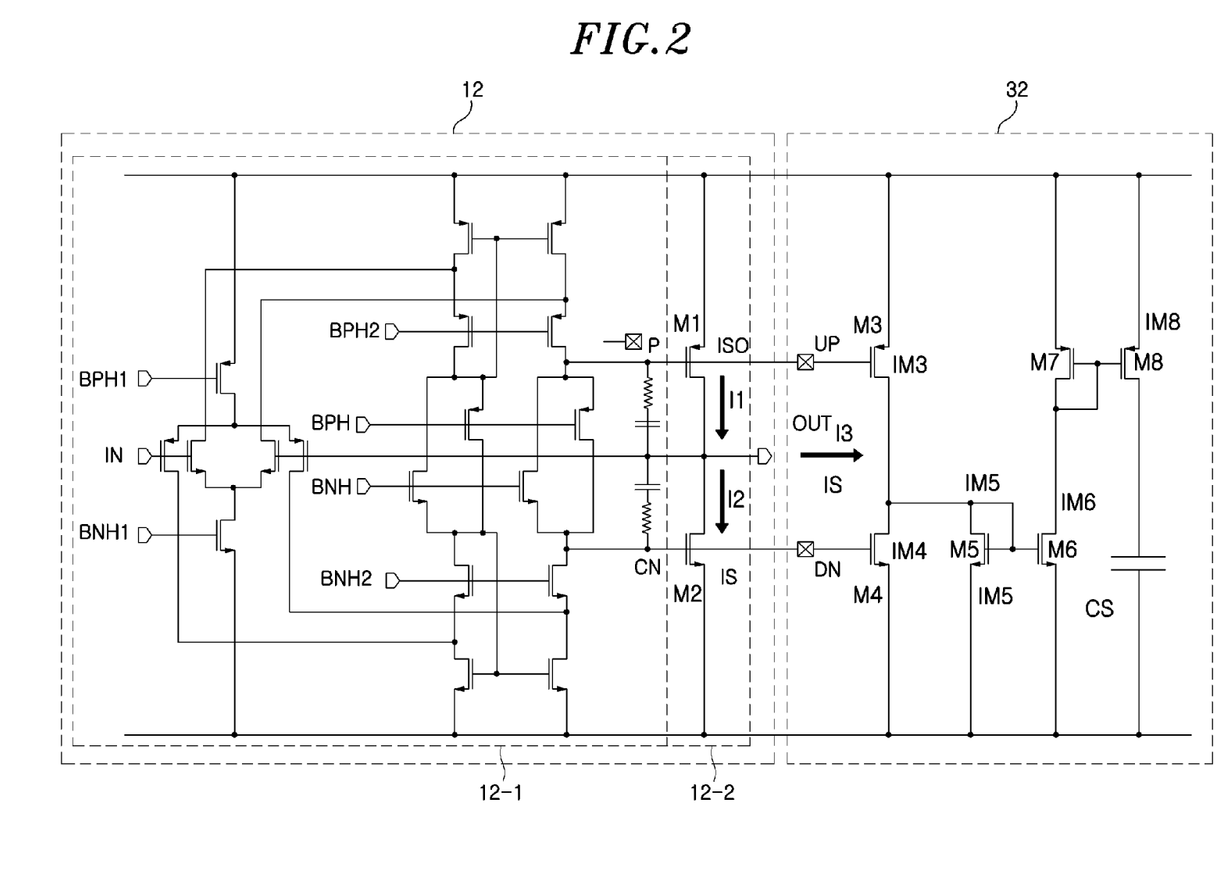
FIG. 2 is a circuit diagram showing the connection between an OP amplifier and a rising current detector, as shown in FIG. 1, and showing a capacitance measuring operation of the touch sensor in accordance with an embodiment of the present invention.
Figure 3:
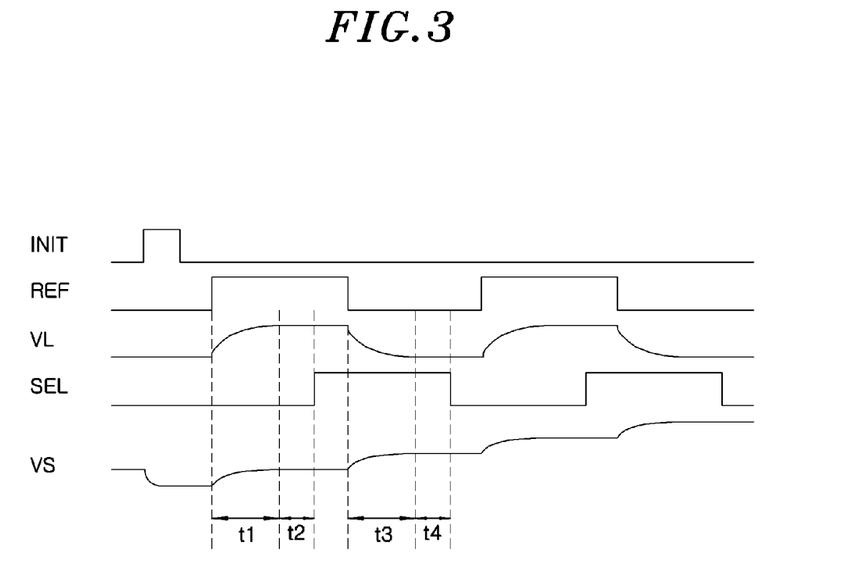
FIG. 3 is a waveform diagram showing signals in a capacitance measuring operation of a touch sensor in accordance with an embodiment of the present invention.

FIG. 2 is a circuit diagram showing the connection between the operational amplifier 12 and the rising current detector 32, which are shown in FIG. 1, and describes a capacitance measuring operation of the touch sensor in accordance with an embodiment of the present invention. FIG. 3 is a waveform diagram showing signals, which are used for explaining a capacitance measuring operation in accordance with an embodiment of the present invention.

Referring to FIG. 2, the operational amplifier 12 is configured with a plurality of MOS (Metal Oxide Semiconductor) transistors and a plurality of resistors. For example, the operational amplifier 12 includes an amplifying unit 12-1 and an output unit 12-2. The amplifying unit 12-1 compares and amplifies a voltage difference between the reference voltage provided from the reference voltage generator 10 and a voltage fed back from an output node of the output unit 12-2. The output unit 12-2 supplies the driving current to the panel load 200 through its output node and includes a first PMOS transistor M1 and a first NMOS transistor M2 that are connected to each other between a supply voltage source and a ground voltage source. Drain electrodes of M2 and M1 are connected to the output nodes of the output unit 12-2. Gates of the first PMOS transistor M1 and the first NMOS transistor M2 are connected to first and second output nodes of the amplifying unit 12-1, respectively.

The rising current detector 32 includes second, third, and fourth NMOS transistors M4, M5, and M6, respectively, second, third, and fourth PMOS transistors, M3, M7, and M8, respectively, and a sensing capacitor CS. A gate electrode of the second NMOS transistor M4 is connected to a gate electrode of the first NMOS transistor M2, a drain electrode of M4 is connected to a drain electrode of the second PMOS transistor M3, and a source electrode of M4 is connected to the ground. The third NMOS transistor M5 includes a drain electrode and a gate electrode, both of which are connected to the drain electrode of the second NMOS transistor M4 and a source electrode connected to the ground. The fourth NMOS transistor M6 includes a gate electrode connected to the gate electrode of the third NMOS transistor M5 and a source electrode connected to the ground. The third PMOS transistor M7 includes a drain electrode and a gate electrode both of which are connected to a drain electrode of the fourth NMOS transistor M6. The fourth PMOS transistor M8 includes a gate electrode connected to the gate electrode of the third PMOS transistor M7. The sensing capacitor CS is connected between a drain electrode of the fourth PMOS transistor M8 and the ground. Sources of the second to fourth PMOS transistors M3, M7, and M8 are connected to the supply voltage source.

If the panel load 200 is driven by a load voltage VL according to a waveform shown in FIG. 3 with the operational amplifier 12, a first current I1 flows through the first PMOS transistor M1. The first current I1 is equal to a sum of a second current I2 and a third current I3. The second current I2 flows to the ground via the first NMOS transistor M2, and the third current I3 drives the panel load 200. This can be represented by the following equation 1:

$$I1 = I2 + I3 \qquad \text{[Equation 1]}$$

The transistor M3 copies (or reproduces) the first current I1 flowing through the transistor M1 because the gate electrodes of the transistors M1 and M3 are connected to each other. Thus gate voltage levels of the transistors M3 and M1 are substantially the same. Similarly, the transistor M4 copies (or reproduces) the second current I2 flowing through the transistor M2, the transistor M6 copies (or reproduces) a current flowing through the transistor M5, and the transistor M8 copies (or reproduces) a current flowing through the transistor M7.

Also, a current IM5 corresponding to (IM3-IM4) is induced at the transistor M5. In order to induce the current IM5, the transistor M5 may have a diode structure.

The current IM5 is copied by the transistor M6, so that a current IM6 is substantially the same as the current IM5. The current IM6 may be applied to the transistor M7.

The current IM6 flowing through the transistor M7 is copied by the transistor M8, so that a current IM8 is substantially the same as the current IM6. The sensing capacitor CS is charged by the current IM8.

After the operation of the panel load 200 is terminated, that is, when the sensing capacitor CS is fully charged, the second current I2 becomes substantially the same as the first current I1. As such, the third current I3 becomes about zero (0). Therefore, a sensing voltage VS corresponding to the electrical potential of the sensing capacitor CS, is no longer varied.

In this manner, the current used for driving the panel load 200 can be accurately charged in the sensing capacitor CS. As such, the capacitance of the load capacitor CL can be accurately measured from the following equation 2:

$$VL \times CLc \times VS \times CSc, \qquad \text{[Equation 2]}$$

wherein VL represents a load voltage, CLc represents the capacitance of the load capacitor CL, VS represents the sensing voltage, and CSc represents the capacitance of the sensing capacitor CS. If it is assumed that VL, VS and CSc are predetermined values, the capacitance CLc of the load capacitor CL can be derived from Equation 2.

An operation for measuring the capacitance of the touch sensor will now be illustrated in detail with reference to the signal waveforms in FIG. 3.

First, the sensing voltage VS is initialized to the ground level when an initializing signal INIT is transitioned from a low logic state to a high logic state.

<Rising Current Drive Mode>

1. After a predetermined time elapses from an initial point of time, the reference voltage REF rises from a first reference voltage Vref1 to a second reference voltage Vref2.

2. The second reference voltage Vref2 has a higher electrical potential than the first reference voltage Vref1. This operation may be defined as a rising current drive mode. In the rising current drive mode, the rising current detector 32 of the capacitive load detector 300 is activated by the selection signal SEL generated in the selection signal generator 30, while the falling current detector 34 is inactivated.

3. After a sufficient driving time, for example, after a time period t1 has elapsed, the load voltage VL can reach the second reference voltage Vref2.

In this rising current drive mode, a current inducted toward the panel load 200 is used as a charging current, is sensed by the rising current detector 32, and is charged in the sensing capacitor CS. After a time period t1+t2 elapses, that is, when the sensing voltage VS increases by a given level, the rising current drive mode is terminated.

<Falling Current Drive Mode>

1. After a predetermined time elapses from the initial point of time, the reference voltage REF falls from the second reference voltage Vref2 to the first reference voltage Vref1.

2. The first reference voltage Vref1 is lower than the second reference voltage Vref2. This operation may be defined as a falling current drive mode. In the falling current drive mode, the falling current detector 34 of the capacitive load detector 300 can be activated by the selection signal SEL generated in the selection signal generator 30, while the rising current detector 32 is inactivated.

3. After a sufficient driving time, for example, after a time period t3, has elapsed, the load voltage VL can reach the first reference voltage Vref1.

In this falling current drive mode, a current inducted toward the panel load 200 is used as a discharging current, is sensed by the falling current detector 34, and is charged in the sensing capacitor CS. After a time period t3+t4 elapses, that is, when the sensing voltage VS increases by a given level, this falling current drive mode is terminated.

The waveform diagram of FIG. 3 represents a panel load 200 that may be driven in the following timing sequence: the initialization mode→the rising current drive mode→the falling current drive mode→the rising current drive mode→the falling current drive mode.

As shown in FIG. 3, the sensing voltage VS repeatedly increases by a given level whenever each current drive mode is terminated. Also, the capacitance of the panel load 200 can be derived from the sensing voltage.

Figure 4A:
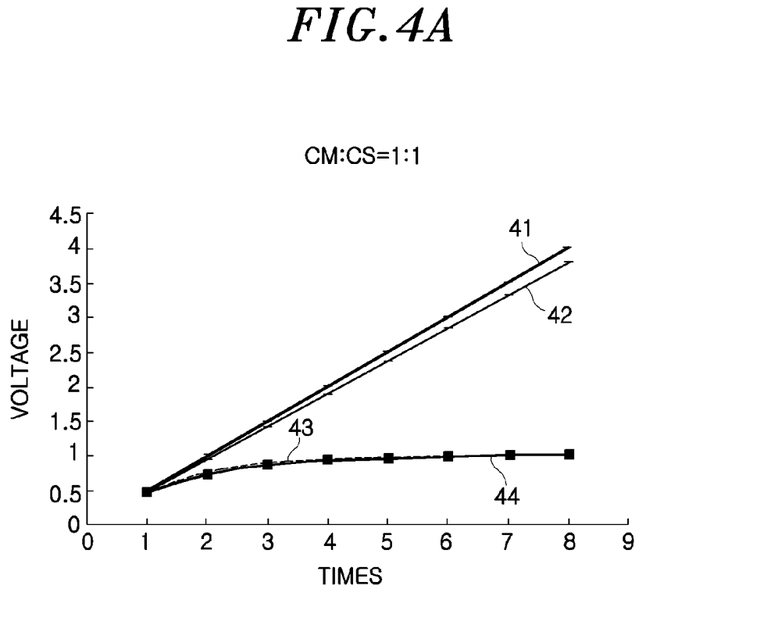
FIGS. 4A through 4C are graphs comparatively showing results obtained from simulations in accordance with an embodiment of the present invention and the related art.
Figure 4B:
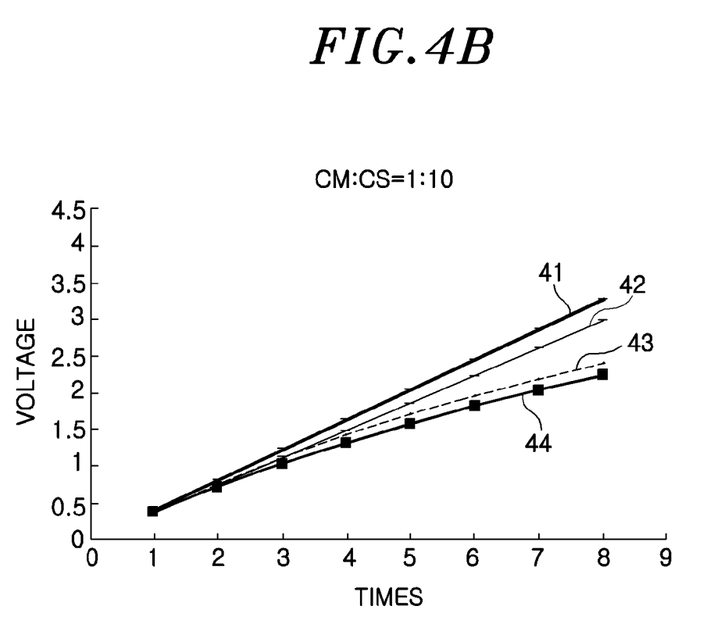
Figure 4C:
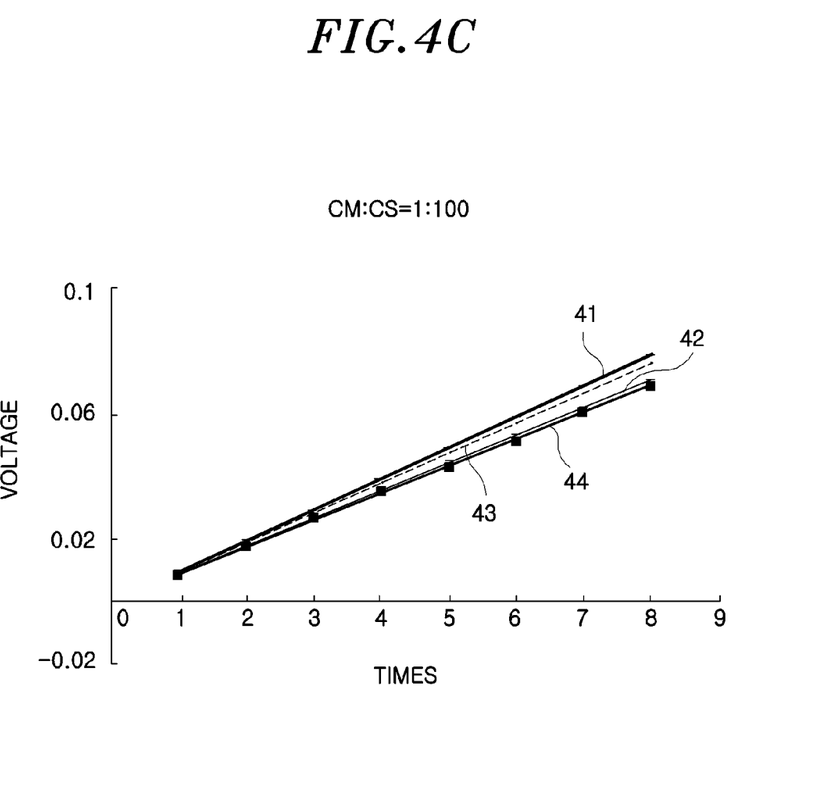

FIGS. 4A through 4C are graphs comparatively showing results of simulations according to embodiments of the present invention and the related art, wherein an X-axis denotes a time of sampling & holding and a Y-axis denotes a voltage.

FIG. 4A is a graph representing measured capacitance when a ratio of a sensing capacitance CS and a mutual capacitance CM is set to 1:1. FIG. 4B is a graph representing measured capacitance when the ratio of the sensing capacitance CS and the mutual capacitance CM is set to 1:10. FIG. 4C is a graph representing measured capacitance when the ratio of sensing capacitance CS and the mutual capacitance CM is set to 1:100. In FIGS. 4A, 4B, and 4C, reference numerals 41 and 42 depict graphs representing the measured capacitance before and after the touch sensor is touched, which are simulated results in accordance with the present invention, respectively. Reference numerals 43 and 44 depict graphs representing measured capacitance before and after the touch sensor is touched, which are simulated results in accordance with the related art, respectively.

As shown in the drawings, the capacitance measuring system of the present invention shows superior accuracy to that of the related art.

As described above, embodiments of the present invention detect the rising and falling components of the driving current, which is applied from the panel driver to the panel load. Also, the capacitance of the load capacitor is measured if the product of the load voltage and the capacitance of the load capacitor is the same as the product of the sensing voltage and the capacitance of the sensing capacitor. Therefore, the variation of the capacitance in the panel load may be rapidly and accurately measured.

According to an embodiment of the present invention, the variation in the capacitance of the panel load may be precisely sensed by detecting the rising and falling current components of the touch sensor. As a result, touch sensitivity may be enhanced, and the circuit configuration may be simplified. Moreover, embodiments of the present invention may show good noise immunity while improving data processing speed.

While the invention has been shown and described with respect to the preferred embodiments, it will be understood by those skilled in the art that various changes and modifications may be made without departing from the scope of the invention as defined in the following claims.

What is claimed is:

1. An apparatus for measuring capacitance in a touch sensor, the apparatus comprising:
   a panel driver configured to drive a panel load in the touch sensor according to a reference voltage; and
   a capacitive load detector configured to measure capacitance of the panel load by sensing a panel load driving current that is applied to the panel load by the panel driver,
   wherein the capacitive load detector includes:
      a rising current detector configured to detect a rising current component of the panel load driving current; and
      a falling current detector configured to detect a falling current component of the panel load driving current,
   wherein the capacitive load detector further includes a sensing capacitor that is charged by the rising current component or the falling current component,
   wherein the capacitive load detector is configured to measure the capacitance of the panel load when the sensing capacitor is fully charged by one of the rising and falling current components,
   wherein the capacitance of the panel load is measured when there is no variation in a sensing voltage obtained by the capacitive load detector, and
   wherein the capacitive load detector is configured to measure the capacitance of the panel load if a product of a load voltage for driving the panel load and capacitance of a load capacitor in the panel load is substantially the same as a product of the sensing voltage and capacitance of the sensing capacitor.

2. The apparatus of claim 1, wherein the panel driver includes:
   a reference voltage generator configured to supply the reference voltage based on an external reference voltage; and
   an amplifier configured to supply the panel load with the panel load driving current in response to the reference voltage.

3. The apparatus of claim 2, wherein the amplifier comprises:
  an amplifying unit configured to amplify a voltage difference between the reference voltage and a voltage fed back from an output node of the amplifier; and
  an output unit coupled to output nodes of the amplifying unit and configured to output the panel load driving current through its output node,
  wherein the output unit includes a first PMOS transistor; and a first NMOS transistor,
  wherein the first PMOS transistor and the first NMOS transistor are coupled to each other and are provided between a supply voltage source and a ground source, and
  wherein the first PMOS and NMOS transistors have gates coupled to the output nodes of the amplifying unit, respectively, and drains coupled to the output node of the output unit.

4. The apparatus of claim 3, wherein the capacitive load detector comprises:
  a second PMOS transistor having a gate electrode coupled to a gate electrode of the first PMOS transistor;
  a second NMOS transistor having a gate electrode coupled to a gate electrode of the first NMOS transistor, a drain electrode coupled to a drain electrode of the second PMOS transistor, and a source electrode coupled to the ground source;
  a third NMOS transistor having a drain electrode and a gate, both of which are coupled to the drain electrode of the second NMOS transistor and a source electrode coupled to the ground source;
  a fourth NMOS transistor having a gate electrode coupled to the gate electrode of the third NMOS transistor and a source electrode coupled to the ground source;
  a third PMOS transistor having a drain electrode and a gate electrode both of which are coupled to a drain electrode of the fourth NMOS transistor;
  a fourth PMOS transistor having a gate electrode coupled to the gate electrode of the third PMOS transistor; and
  a sensing capacitor coupled to and disposed between a drain electrode of the fourth PMOS transistor and the ground source, and
  wherein sources of the first to fourth PMOS transistors are coupled to the supply voltage source.

5. The apparatus of claim 4, wherein a first current flowing through the first PMOS transistor is substantially the same as a sum of a second current flowing to the ground source through the first NMOS transistor and the panel load driving current flowing into the panel load.

6. The apparatus of claim 4, wherein the current of the third PMOS transistor copied by the fourth PMOS transistor is charged in the sensing capacitor.

7. The apparatus of claim 4, wherein the first current flowing through the first PMOS transistor is substantially the same as the second current flowing to the ground via the first NMOS transistor when the sensing capacitor is fully charged.

8. The apparatus of claim 7, wherein the panel load driving current flowing into the panel load becomes zero (0) when the sensing capacitor is fully charged.

9. The apparatus of claim 1, wherein the capacitive load detector is configured to detect rising and falling current components of the panel load driving current after the touch sensor is initialized.

10. The apparatus of claim 1, wherein the rising current detector and the falling current detector are inversely activated in response to a selection signal, the rising current detector is activated to detect the rising current component of the panel load driving current when the selection signal has a low value, and the falling current detector is activated to detect the falling current component from the panel load driving current when the selection signal has a high value.

11. The apparatus of claim 10, wherein the rising current component is generated when the panel load is driven by a high voltage.

12. The apparatus of claim 10, wherein the falling current component is generated when the panel load is driven by a low voltage.

* * * * *